United States Patent
Yang (10) Patent No.: US 12,489,023 B2
(45) Date of Patent: Dec. 2, 2025

(54) PACKAGE STRUCTURE AND METHOD OF FORMING THEREOF

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 528 days.

(21) Appl. No.: 18/052,567

(22) Filed: Nov. 3, 2022

(65) Prior Publication Data
US 2024/0153833 A1    May 9, 2024

(51) Int. Cl.
| | |
|---|---|
| H01L 23/13 | (2006.01) |
| H01L 21/48 | (2006.01) |
| H01L 21/56 | (2006.01) |
| H01L 23/00 | (2006.01) |
| H01L 23/31 | (2006.01) |
| H01L 23/498 | (2006.01) |

(52) U.S. Cl.
CPC .......... *H01L 23/13* (2013.01); *H01L 21/4853* (2013.01); *H01L 21/563* (2013.01); *H01L 21/565* (2013.01); *H01L 23/3135* (2013.01); *H01L 23/49816* (2013.01); *H01L 23/49838* (2013.01); *H01L 24/32* (2013.01); *H01L 24/48* (2013.01); *H01L 24/73* (2013.01); *H01L 2224/32225* (2013.01); *H01L 2224/48221* (2013.01); *H01L 2224/73215* (2013.01); *H01L 2924/1436* (2013.01); *H01L 2924/15151* (2013.01)

(58) Field of Classification Search
None
See application file for complete search history.

(56) References Cited

U.S. PATENT DOCUMENTS

| | | | |
|---|---|---|---|
| 2004/0212068 A1* | 10/2004 | Wang | H01L 24/49 257/E25.013 |
| 2015/0035142 A1* | 2/2015 | Kim | H01L 23/49822 257/737 |
| 2019/0157197 A1* | 5/2019 | Fang | H01L 24/85 |
| 2022/0285315 A1* | 9/2022 | Lee | H01L 24/49 |

FOREIGN PATENT DOCUMENTS

| | | |
|---|---|---|
| TW | 200924130 A | 6/2009 |
| TW | 202238758 A | 10/2022 |

* cited by examiner

*Primary Examiner* — Cory W Eskridge
(74) *Attorney, Agent, or Firm* — CKC & Partners Co., LLC (57) ABSTRACT

A package structure includes a first substrate, a second substrate, a chip, a first wire and a second wire. The first substrate includes a top surface, a bottom surface, a window and a first conductive pad. The bottom surface of the first substrate is opposite to the top surface. The window communicates the top surface and the bottom surface. The first conductive pad is located over the bottom surface. The second substrate is located over the first substrate. The second substrate is spaced from the first substrate and includes a second conductive pad facing the top surface of the first substrate and exposed from the window. The chip is located over the second substrate. The first wire connects the first conductive pad to the second conductive pad. The second wire connects the second conductive pad to the third conductive pad.

18 Claims, 13 Drawing Sheets

PACKAGE STRUCTURE AND METHOD OF FORMING THEREOF

BACKGROUND

Field of Invention

The present disclosure relates to package structures and method of forming a package structure.

Description of Related Art

A DDR5 DRAM package structure can be formed by a substrate and a memory chip bonded on the substrate/circuit board. For example, a face-down memory with a pad facing the substrate to be bonded can be connected to pads directly under the substrate by a copper pillar bump. However, it takes a lot of time to form copper pillar bump for connection.

Therefore, how to provide a package structure formed by a chip bonded on the substrate in a quick manner is one of the subjects to be solved for the industry.

SUMMARY

An aspect of the present disclosure is related to a package structure.

According to one or more embodiment of the present disclosure, a package structure includes a first substrate, a second substrate, a chip, a first wire and a second wire. The first substrate includes a top surface, a bottom surface, a window and a first conductive pad. The bottom surface of the first substrate is opposite to the top surface. The window communicates the top surface and the bottom surface. The first conductive pad is located over the bottom surface. The second substrate is located over the first substrate. The second substrate is spaced from the first substrate and includes a second conductive pad facing the top surface of the first substrate and exposed from the window. The chip is located over the second substrate. The first wire connects the first conductive pad to the second conductive pad. The second wire connects the second conductive pad to the third conductive pad.

In one or more embodiments of the present disclosure, the package structure further includes an attach film. The attach film is located between the first substrate and the chip. The third conductive pad and the second wire are covered by the attach film.

In some embodiments, the second conductive pad of the second substrate a first portion and a second portion. The first portion is connected to the first wire and exposed from the window of the first substrate.

In one or more embodiments of the present disclosure, the package structure further includes an attach film filled with a space between the chip and the first substrate. The attach film includes a first film portion and a second film portion. The first film portion covers a sidewall of the second substrate and extends between the first substrate and the second substrate. The second film portion is filled with a gap between the chip and the second substrate. The second substrate is sandwiched by the first film portion and the second film portion.

In one or more embodiments of the present disclosure, a portion the first wire is extended between the first substrate and the second substrate.

In one or more embodiments of the present disclosure, the second conductive pad and the third conductive pad are connected by the second wire through the window.

In one or more embodiments of the present disclosure, the package structure further includes a molding compound. The first conductive pad and the first wire are covered by the molding compound.

In some embodiments, the second conductive pad includes a first portion and a second portion. The first portion is connected to the first wire, exposed from the window of the first substrate and covered by the molding compound. The second portion is connected to the second wire and covered by the first substrate.

In one or more embodiments of the present disclosure, the package structure further includes a conductive bump. The conductive bump is located on the bottom surface of the first substrate.

An aspect of the present disclosure is related to a package structure.

According to one or more embodiment of the present disclosure, a package structure includes a first substrate, a second substrate, a chip, a first wire and a second wire. The first substrate has a first conductive pad. The second substrate is located on the second substrate and has a second conductive pad. The chip is located on the first substrate and has a third conductive pad. The second substrate is located between the first substrate and the second substrate. The first wire connects the first conductive pad to the second conductive pad. The second wire connects the second conductive pad to the third conductive pad.

In one or more embodiments of the present disclosure, the first substrate comprises a window exposing the second conductive pad of the second substrate. The second conductive pad is connected to the third conductive pad by the second wire through the window.

In one or more embodiments of the present disclosure, the package structure further includes an attach film. The attach film is filled with a space between the first substrate and the chip. The attach film includes a first film portion and a second film portion. The first film portion covers a sidewall of the second substrate and extending between the first substrate and the second substrate. The second film portion is filled with a gap between the chip and the second substrate. The second substrate is sandwiched by the first film portion and the second film portion.

In one or more embodiments of the present disclosure, the first substrate includes a first bottom surface in which the first conductive pad located on and a first top surface opposite to the first bottom surface. The second substrate includes a second bottom surface spaced from the first top surface and a second top surface being with the second conductive pad and opposite to the second bottom surface. The third conductive pad of the chip faces the first top surface.

In one or more embodiments of the present disclosure, a portion of the first wire is extended between the first substrate and the second substrate.

An aspect of the present disclosure is related to a method of forming a package stricture.

According to one or more, a method of forming a package structure includes following operations. A first substrate is provided with a first conductive pad, a second substrate with a second conductive pad and a chip with a third conductive pad, wherein the first substrate comprises a top surface, a bottom surface opposite to the top surface and a window communicating the top surface and the bottom surface. The second substrate is attached on the chip. A first wire is bonded between the second conductive pad and the third conductive pad. The first substrate is attached on the second substrate, wherein a portion of the second conductive pad is exposed from the window of the first substrate. A second wire is bonded between the first conductive pad and the second conductive pad.

In one or more embodiments of the present disclosure, the attaching the second substrate on the chip includes following operations. An attach film is attached on a surface in which the third conductive pad is located on. The second substrate is attached on the surface of the chip by the attach film.

In one or more embodiments of the present disclosure, the attaching the top surface of the first substrate on the second substrate includes following operations. An attach film is attached on the chip and the second substrate after the first wire is bonded between the second conductive pad and the third conductive pad, wherein the first wire is covered by the attach film. The top surface of the first substrate is attached on the second substrate by the attach film.

In one or more embodiments of the present disclosure, the method of forming the package structure includes following operations. Molding compound is formed to cover the second wire exposed from the window of the first substrate.

In one or more embodiments of the present disclosure, the attaching the second substrate on the chip includes following operations. A conductive bump is formed on the bottom surface of the first substrate.

In one or more embodiments of the present disclosure, the method of forming the package structure includes following operations. The first substrate, the second substrate and the chip are flipped after the second wire is formed.

In summary, the chip and the substrate can be bonded together through an addition substrate there between, and time to manufacture a package structure can be reduced.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

A chip and a substrate/circuit board can be bonded together to form a package structure. For example, a memory chip with integrated circuits of memory devices can be bonded on a substrate to form a memory package structure.

In some embodiments, a ball grid array (BGA) packing process can be used for bonding a chip on a substrate. The BGA packing process can be performed by forming conductive balls, e.g., copper pillar conductive bumps, on the chip to be bonded to electrically connecting the chip to the substrate. A window BGA (wBGA) packing can be further performed with a substrate with an opening window. However, it takes a lot of time to form copper pillar bumps for connection.

In some embodiments, conductive pad used for electric connecting the chip and the designed connecting wire can be provided on the substrate to be bonded, and designed function can be achieved after the chip is bonded on the substrate. A plurality of copper pillar bumps for connection should be formed on the chip before the chip is bonded to the substrate, and it takes a lot of time to form copper pillar bumps on the chip. Once a type of the chip to be bonded is changed, the designed pattern of conductive pads, connecting wire inside and the formed copper pillar bumps would fail. For the purpose to quickly test the package structure formed by the chip and the substrate, a packaging technique with high-efficiency is required.

Figure 1A:
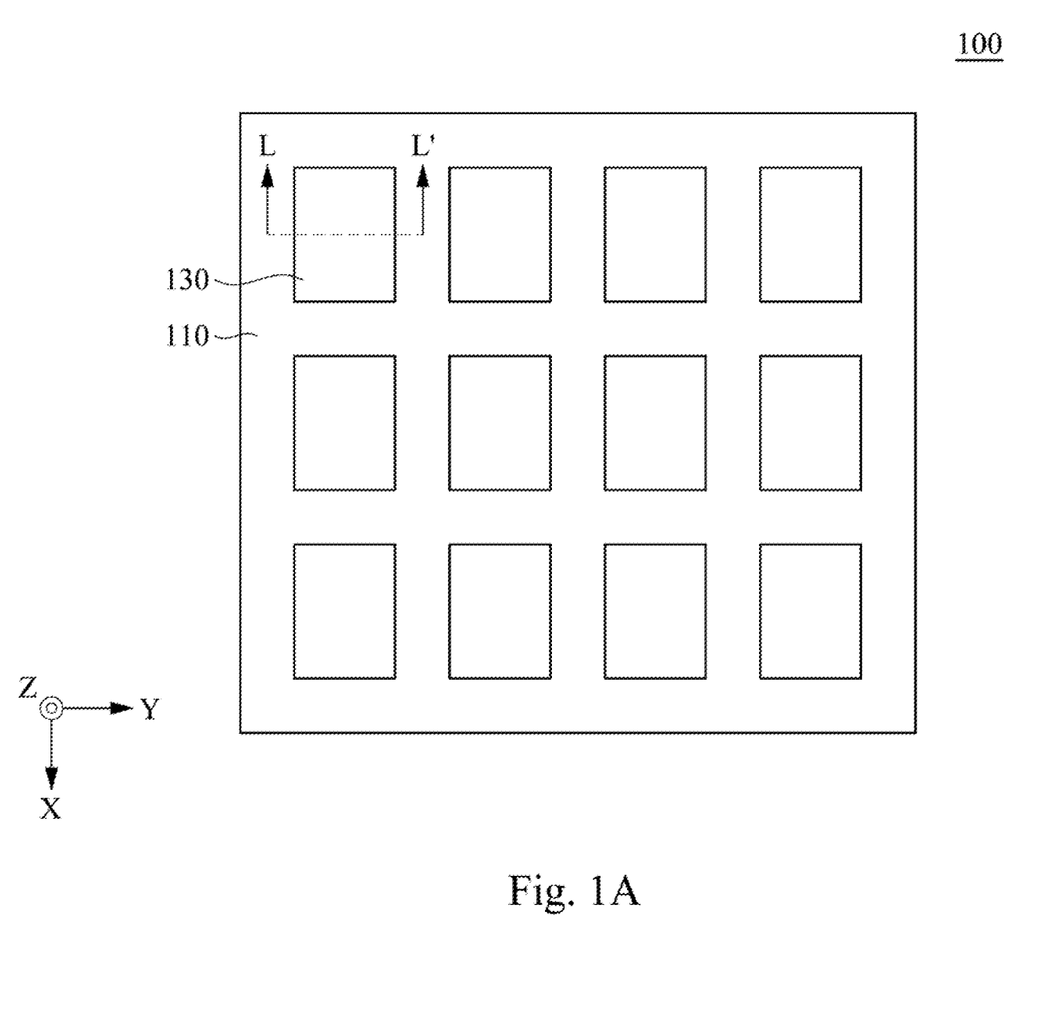
FIG. 1A illustrates a schematic view of a package structure according to one embodiment of the present disclosure.
Figure 1B:
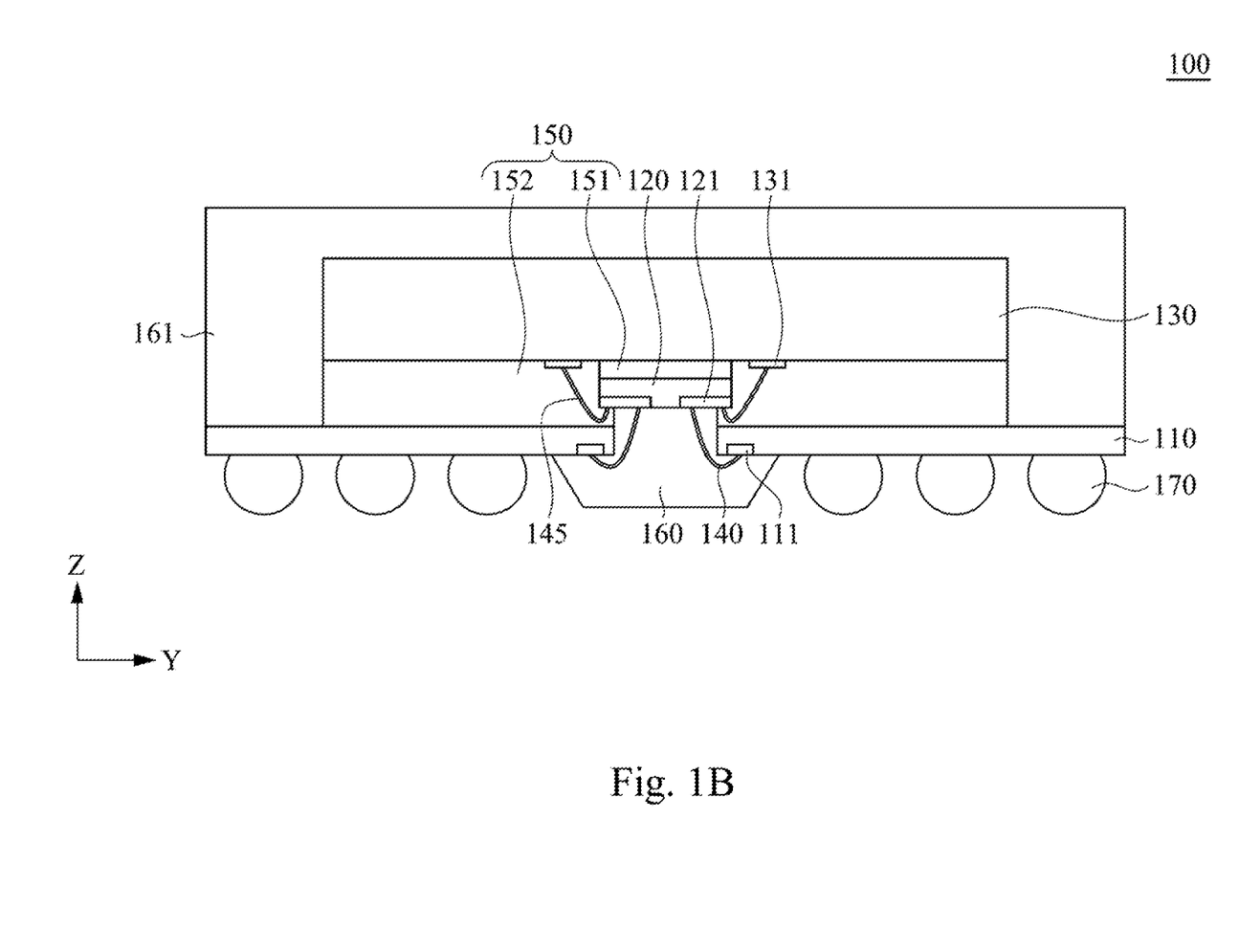
FIG. 1B illustrates a cross-section view along a line L-L' of FIG. 1A.

Reference is made by FIGS. 1A and 1B. FIG. 1A illustrates a schematic view of a package structure 100 according to one embodiment of the present disclosure. FIG. 1B illustrates a cross-section view along a line L-L' of FIG. 1A.

As shown in FIG. 1A, in one or more embodiment of the present disclosure, a package structure 100 includes a substrate 110 and one or more chips 130. The substrate 110 can be regarded as a circuit board with conductive pads and connecting wires inside. In this embodiment, a plurality of chips 130 is bonded on a top surface of the substrate 110. The chips 130 are arranged along a direction x and a diction y. In some embodiments, larger or few numbers of the chip with respect to the numbers of the chip 130 on the substrate 110 as shown in FIG. 1A can be used. In some embodiments, one or more of the chips 130 include memory devices and integrated circuits inside, and the package structure 100 can be regarded as a memory package structure.

It should be noted that some elements are not shown in FIG. 1A for the purpose of simple descriptions. For example, in some embodiments, connecting wires formed on the top surface of the substrate 110 are not shown in FIG. 1A. In addition, for the purpose of clear descriptions, a molding compound (e.g., molding compound 161 as shown in following FIG. 1B) covering the chips 130 are not illustrated in FIG. 1A.

Reference is made by FIG. 1B to further illustrate a local bonding of one of the chips 130 and the substrate 110. It should be noted that some elements are not shown in FIG. 1B for the purpose of simple descriptions. For example, in some embodiments, a plurality connecting wires provided to connect the conductive pads and the conductive bumps are not shown on the cross-section view of FIG. 1B.

As shown in FIG. 1B, one of the chips 130 is bonded on the substrate 110. The chip 130 is located on a top surface (e.g. surface 110T in following figures) of the substrate 110. The chip 130 has a plurality of conductive pads 131. In this embodiment, the chip 130 is a face-down chip. That is, the conductive pads 131 are located on a top surface (i.e., surface 130T in following figures) facing the top surface of the substrate 110, so that the conductive pads 131 of the chip 130 are located between the chip 130 and the substrate 110.

Further, in this embodiment as shown in FIG. 1B, the package structure 100 includes a substrate 120 located between the substrate 110 and the chip 130. The substrate 120 includes a plurality of conductive pads 121. As shown in FIG. 1B, the conductive pads 121 of the substrate 120 are between the substrate 110 and the chip 130, and a distance between the conductive pads 121 and the substrate 110 is less than a distance between the conductive pads 131 and the substrate 110.

In FIG. 1B, the substrate 110 includes a window (i.e., window 110W in following figures) communicating the top surface and an opposite bottom surface (i.e., bottom surface 110b in following figures) of the substrate 110. The window of the substrate 110 can be regarded as an opening used for connections. The substrate 120 between the substrate 110 and the chip 130 is aligned with the window of the substrate 110, so that the conductive pads 121 are exposed from the window of the substrate 110.

As shown in FIG. 1B in this embodiment, along the direction y, a distance between the two conductive pads 131 is greater than a width of the window 110W (i.e., window 110W in following figures). Thus, the conductive pads 131 should be electrically connected to the conductive pads 111 through the second substrate 120 being between the first substrate 110 and the chip 130 and with the conductive pads 121. In some embodiment, the width of the window 110W is provided according to Joint Electron Device Engineering Council (JEDEC) standard, so that the width of the window 110W is limited to be less than a determined value.

In some embodiments, along the direction y, the distance between the two conductive pads 131 is greater than a distance between the two conductive pads 111.

In this embodiment, the package structure further includes a plurality of wires 140 and wires 145. As shown in FIG. 1B, two ends of one of the wire 145 are respectively connected to one of the conductive pads 131 of the chip 130 and one of the conductive pads 121 of the substrate 120, and two ends of one of the wire 140 are respectively connected to one of the conductive pads 121 of the substrate 120 and one of the conductive pads 111 of the substrate 110. The wires 140 extend through the window of the substrate 110. A portion of each of the wire 145 is extended between the substrate 120 and the substrate 110.

In some embodiments, the wires 140 and wires 145 can be gold wires. In some embodiments, the wires 140 and wires 145 can include other conductive material suitable for bonding.

As shown in FIG. 1B, in this embodiment, the package structure includes an attach film 150, and the chip 130 and the substrate 120 are bonded on the substrate 110 by the attach film 150. Specifically, in this embodiment, the attach film 150 includes a first attach portion 151 and a second attach portion 152. The substrate 120 is bonded to the chip 130 by the first attach portion 151 between the substrate 120 and the chip 130. The chip 130 is bonded to the substrate 110 by the second attach portion 152 filled with a space between the chip 130 and the top surface of the substrate 110. In some embodiments, material of the first attach portion 151 is the same as material of the second attach portion 152. In some embodiments, the first attach portion 151 and the second attach portion 152 can be formed in different processes.

In this embodiment, the package structure 100 further includes molding compounds 160 and 161. As shown in FIG. 1B, the conductive pads 121 exposed from the window of the substrate 110, the conductive pads 111 on the bottom surface of the substrate 110 and the wires 140 connecting the conductive pads 111 and the conductive pad 121 through the window of the substrate 110 are covered by the molding compound 160. The chip 130, the attach film 150 and the top surface of the substrate 110 are covered by the molding compound 161. The molding compounds 160 and 161 are able to protect the exposed elements of the package structure 100.

In FIG. 1B, the package structure 100 further includes a plurality of conductive bumps 170. The conductive bumps 170 are located on the bottom surface opposite to the top surface in which the chip 130 is bonded on. In some embodiments, the conductive bumps 170 can be electrically connected to one or more conductive pads 111 through one or more connecting wires inside the substrate 110. In some embodiments, the conductive bumps 170 can be tin metal solder balls.

In summary, the chip 130 is electrically connected to the substrate 110 (e.g., a circuit board) through the substrate 120 between the chip 130 and the substrate 110. No further conductive pillar bump formed on the chip 130 is required.

As shown in FIG. 1B, the substrate 110, the substrate 120 and the chip 130 are stacked along a direction z. In this embodiment, along a direction y perpendicular to the direction z, a width of the substrate 120 is less than a width of the substrate 110 or a width of chip 130. In this embodiment, the width of the substrate 120 is greater than a width of the window of the substrate 110 along the direction y. In some embodiments, the width of the substrate 120 is less or greater than a width of the window of the substrate 110 along the direction y, and the conductive pads 121 of the substrate 120 can be still exposed from the window of the substrate 110.

Referring to FIGS. 1A and 1B, in one or more embodiments of the present disclosure, one or more substrates 120 can be located between the chips 130 and the substrate 110. The one or more substrates 120 between the chips 130 can be bonded between the chips 130 and the substrate 110. In the same operations. In details, please refer to following discussion.

Figure 2:
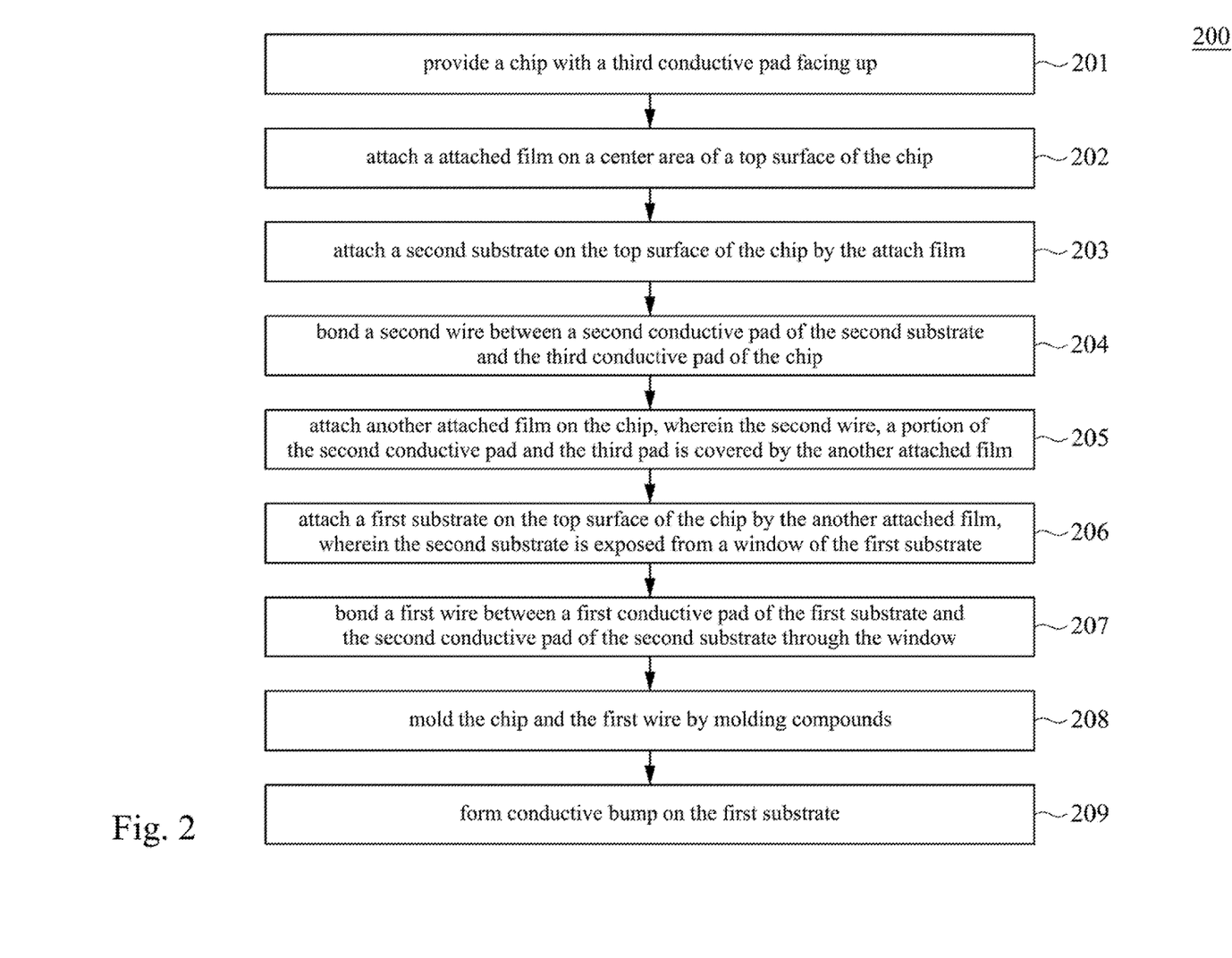
FIG. 2 illustrates a method of forming a package structure according one embodiment of the present disclosure.

Reference is made by FIG. 2 and FIGS. 3-12 to illustrate operations of a method of forming the package structure 100. FIG. 2 illustrates a method 200 of forming a package structure (e.g., package structure 100) according one embodiment of the present disclosure, wherein the method 200 includes operations 201-209. FIGS. 3-12 illustrate schematic cross-section views in operations of a method of forming a package structure according one embodiment of the present disclosure.

Figure 3:
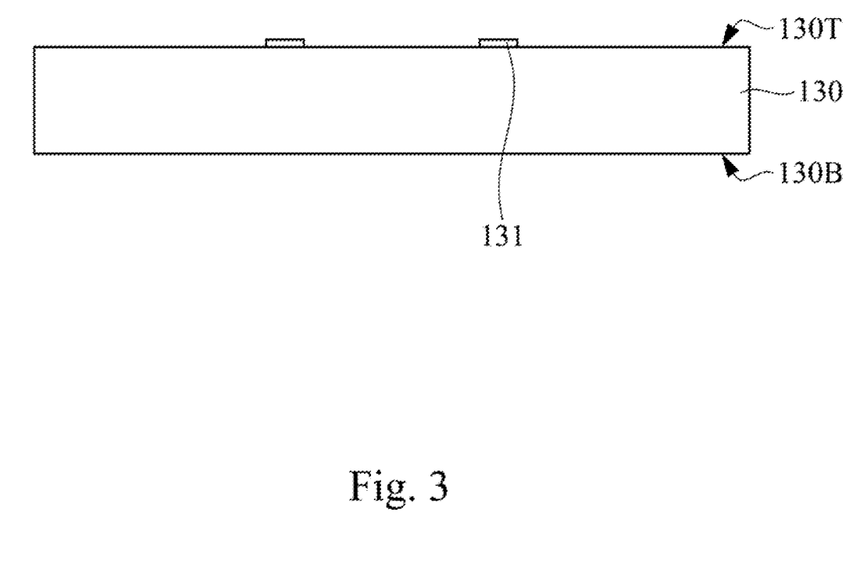
FIGS. 3-12 illustrate schematic cross-section views in operations of a method of forming a package structure according one embodiment of the present disclosure.

Referring to FIGS. 2 and 3. In operation 201, a chip 130 with one or more conductive pads 131 is provided. The conductive pads 131 can be regarded as third conductive pads on the chip 130. The chip 130 facing up includes a top surface 130T and a bottom surface 130B opposite to the top surface 130T along a vertical direction z.

In this embodiment, the chip 130 includes a plurality of conductive pads 131 on the top surface 130T of the chip 130. The conductive pads 131 can be connected to circuits or devices inside the chip 130. For example, in some embodiments, the chip 130 can be a DRAM chip including a plurality of memory cells and integrated circuit inside, and the memory cells can includes capacitors and transistors, the conductive pads 131 are used for electrical connections of the memory cells in the chip 130.

Figure 4:
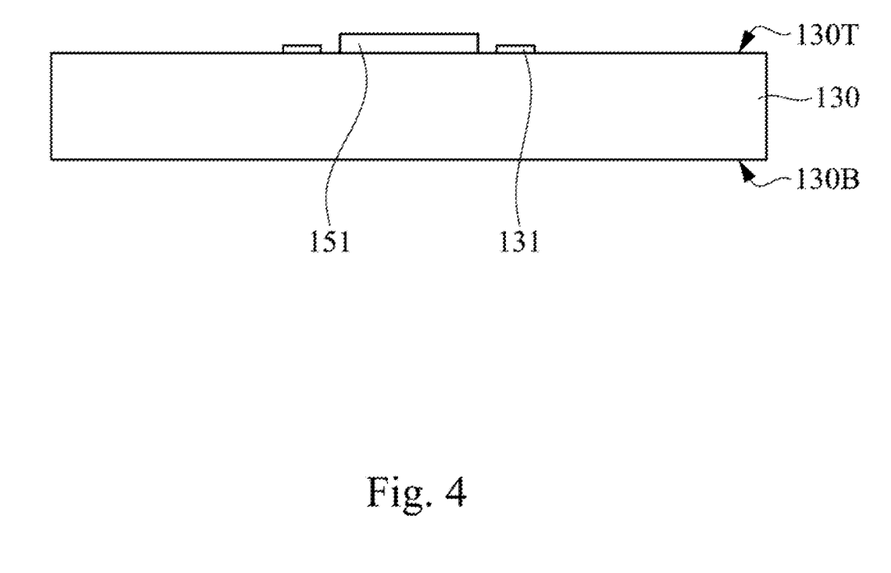

Referring to FIGS. 2 and 4. In operation 202, an attach film is attached on a center area of the top surface 130T of the chip 130. In FIG. 4, a first attach portion 151 of an attach film is formed between two of the conductive pads 131 on the top surface 130T of the chip. The first attach portion 151 is used for attaching further elements on the top surface 130T of the chip 130. In some embodiments, the first attach portion 151 can be die attach film (DAF).

Figure 5:
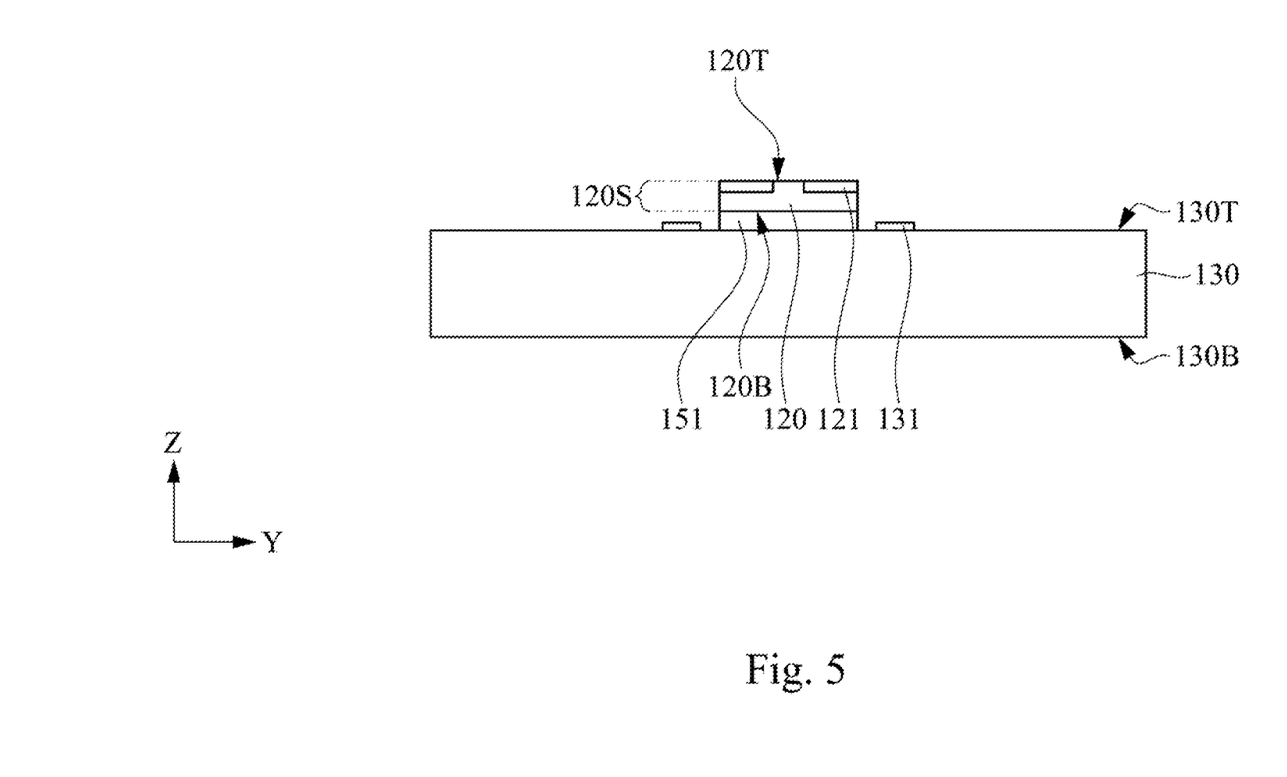

Referring to FIGS. 2 and 5. Proceed to operation 203. The substrate 120 is attached on the top surface 130T of the chip 130. The substrate 120 can be regarded as a second substrate.

As shown in FIG. 5, the substrate 120 includes a top surface 120T and a bottom surface 120B opposite of the top surface 120T. A sidewall 120S of the substrate 120 is connected between the top surface 120T and the bottom surface 120B. The bottom surface 120B of the substrate 120 is attached to the top surface 130T of the chip 130 by the first attach portion 151 between the two of the conductive pads 131.

In this embodiment, as shown in FIG. 5, the conductive pads 121 are embedded in the top surface 120T to reduce a thickness of the substrate 120 along the direction z. It should be noted that the substrate 120 can be manufactured in other pervious process, and few time is used for attaching the substrate 120.

Figure 6:
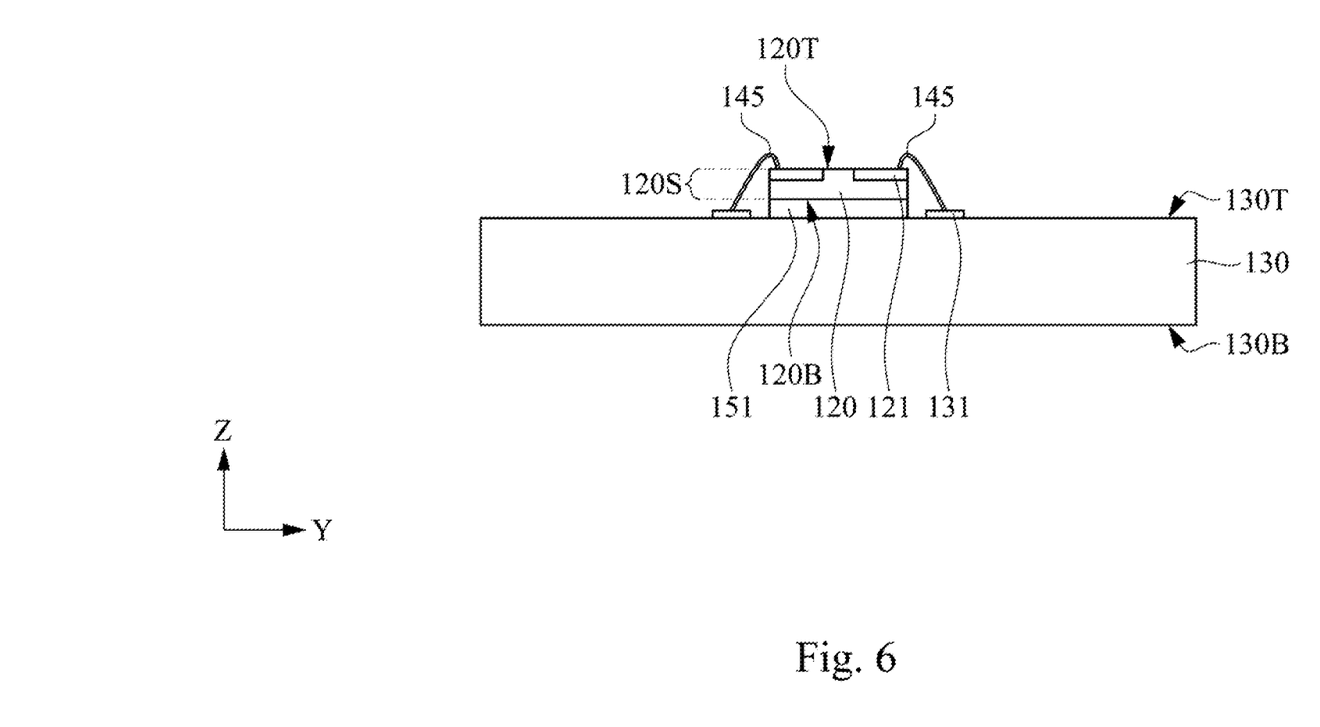

Referring FIGS. 2 and 6. Proceed to operation 204. The conductive pads 121 of the substrate 120 are bonded to the conductive pads 131 of the chip 130 by a plurality of wires 145. The wires 145 can be regarded as second wires. Each of the wire 145 has two ends respectively connecting a corresponding one of the conductive pad 131 to a corresponding one of the conductive pad 121. A portion of each of the wire 145 is extended over a top of a corresponding one of the conductive pad 121.

As shown in FIG. 6, in this embodiment, a thickness of the attach portion 151 is greater than a thickness of any of the conductive pads 131 along the direction z, so that the sidewall 120S of the substrate 120 is exposed from the two conductive pads 131 along the direction y.

Figure 7:
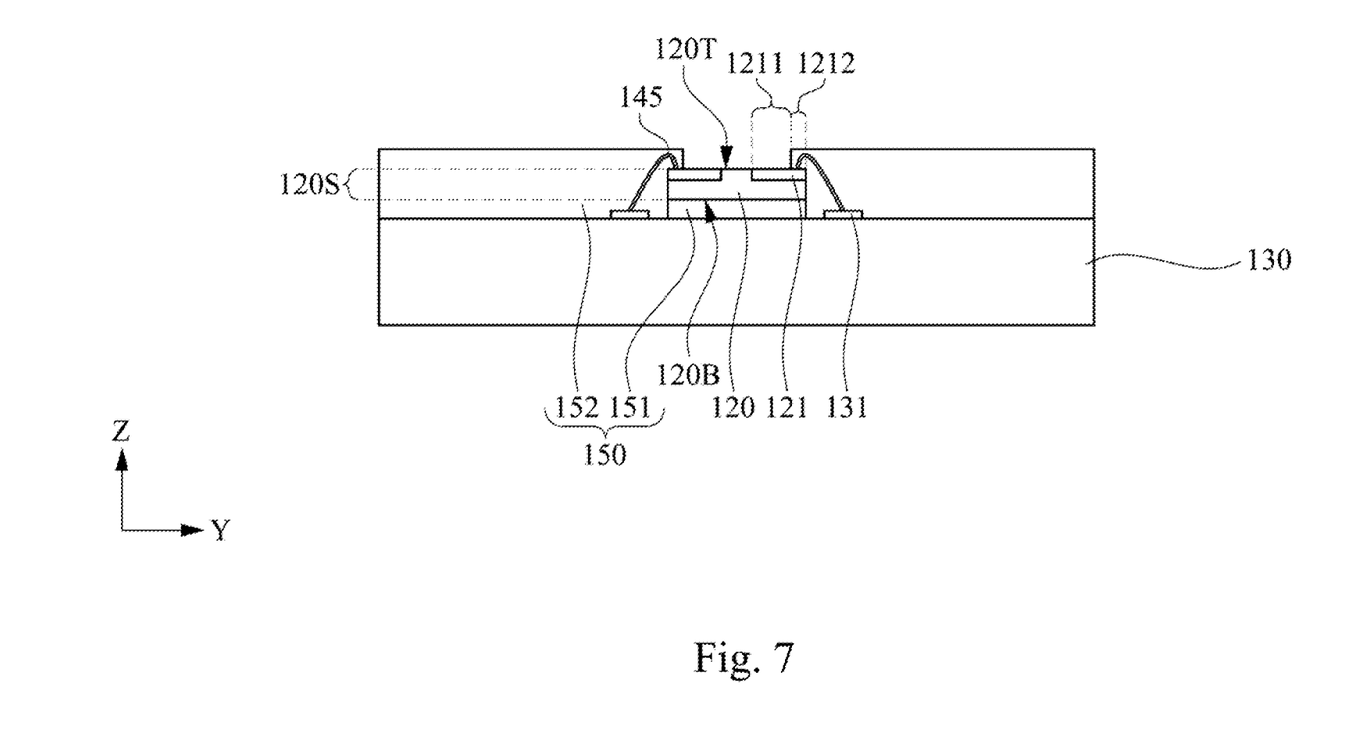

Referring FIGS. 2 and 7. In operation 205, another attach film is attached on the chip 130. As shown in FIG. 7, a second attach portion 152 is formed to cover the exposed conductive pads 131, the sidewall 120S of the substrate 120 and a portion 1212 of any of the conductive pads 121. In other words, the second attach portion 152 overlaps the portion 1212 of each of the conductive pads 121. A portion 1211 of each of the conductive pads 121 is exposed from the second attach portion. The wires 145 bonding the conductive pads 121 and the conductive pads 131 are also covered by the second attach portion 152.

In some embodiments, the second attach portion 152 can also be DAF. In this embodiment, the first attach portion 151 and the second attach portion 152 can be regarded as the attach film 150. After the attach film 150 is formed, a portion 1211 of each of the conductive pads 121 and a portion of the top surface 120T of the substrate are exposed from the attach film 150.

It should be noted that the wires 145 over the portions 1212 of the conductive pads 121 are also covered by the second attach portion 152 of the attach film 150, so that the overall wires 145 are surrounded by the attach film 150. As such, the attach film 150 are able to protect the wires 145 from other elements. In some embodiments, the attach film 150 is insulated.

Figure 8:
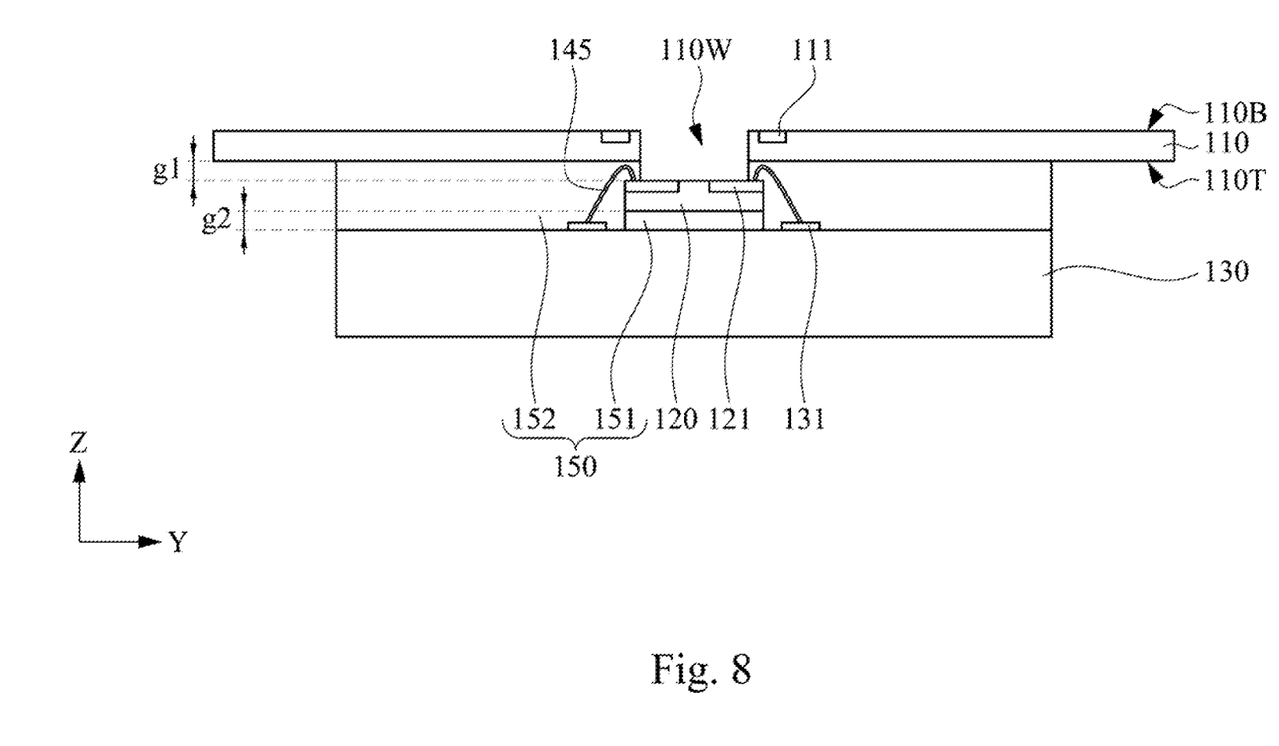

Refer to FIGS. 2 and 8 and proceed to operation 206. The substrate 110 is attached on the top surface 130T of the chip 130 through the first attach portion 151 of the attach film 150. As shown in FIG. 8, the substrate 110 includes a top surface 110T, a bottom surface 110B opposite to the top surface 110T and a window 110W communicated with the top surface 110T and the bottom surface 110B. In this embodiment, the exposed top surface 120T and the exposed portions 1211 of the conductive pads 121 are aligned with and exposed from the window 110W of the substrate 110. The conductive pads 121 of the substrate 120 and the conductive pads 131 of the chip 130 face the top surface 110T of the substrate 110.

As shown in FIG. 8, after the substrate 110 is attached on the chip 130 by the attach film 150, a gap g1 along the direction z is between the substrate 110 and the substrate 120, and a gap g2 along the direction z is between the substrate 120 and the chip 130. The substrate 120 is spaced from the substrate 110 and the chip 130 through the attach film 150 along the direction y.

In this embodiment, the gap g1 allows that the wires 145 extend to the conductive pads 121. The second attach portion 152 of the attach film 150 is extended between the substrate 110 and the chip 120 to surround the wires 145 through the gap g1. The second attach portion 152 filled with the gap g1. In this embodiment, the gap g2 is greater than a thickness of any of the conductive pads 131. In some embodiments, the gap g2 is less than a thickness of any of the conductive pads 131.

Referring to FIGS. 7 and 8. In this embodiment, an interface between the portion 1211 and the portion 1212 of one of the conductive pads 121 is aligned with an edge the window 110w of the substrate 110. In some embodiments, the attach film 150 can be extended beyond window 110W of the substrate 110 to ensure the wires 145 are covered by the attach film 150, however, the portions 1212 exposed from the window 110W and being not covered by the attach film 150 remain. The remaining portions 1212 of the conductive pads 121 are used to be electrically connected to the conductive pads 111 in the following operations.

In this embodiment, the conductive pads 111 are embedded in the bottom surface 110B to further reduce the thickness occupied by the conductive pads 111 along the direction z.

Figure 9:
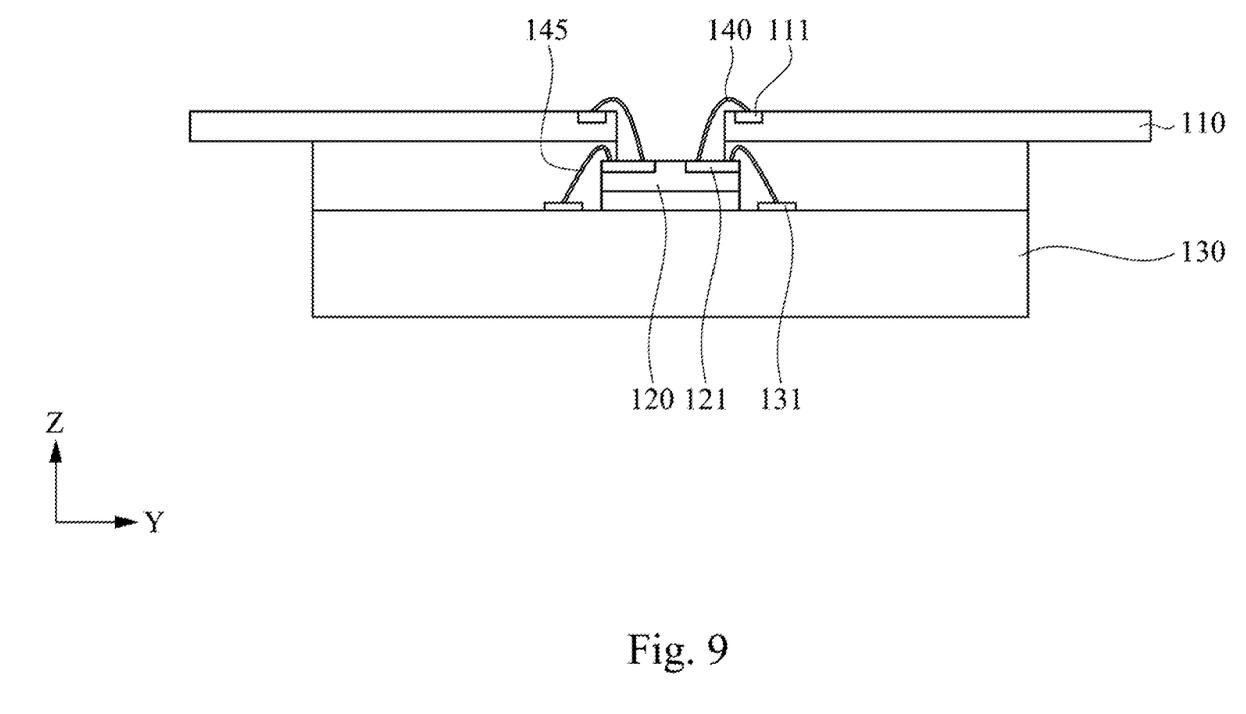

Referring to FIGS. 2 and 9. In operation 207, a plurality of wires 140 is bonded between the conductive pads 121 of the substrate 120 and the conductive pads 111 of the substrate 110 through the window 110W. The wires 140 can be regarded as first wires.

After operation 207 is performed, the conductive pads 131 of the chip 130 are electrically connected to the conductive pads 111 of the substrate 110 through the conductive pads 121 of the substrate 120.

Figure 10:
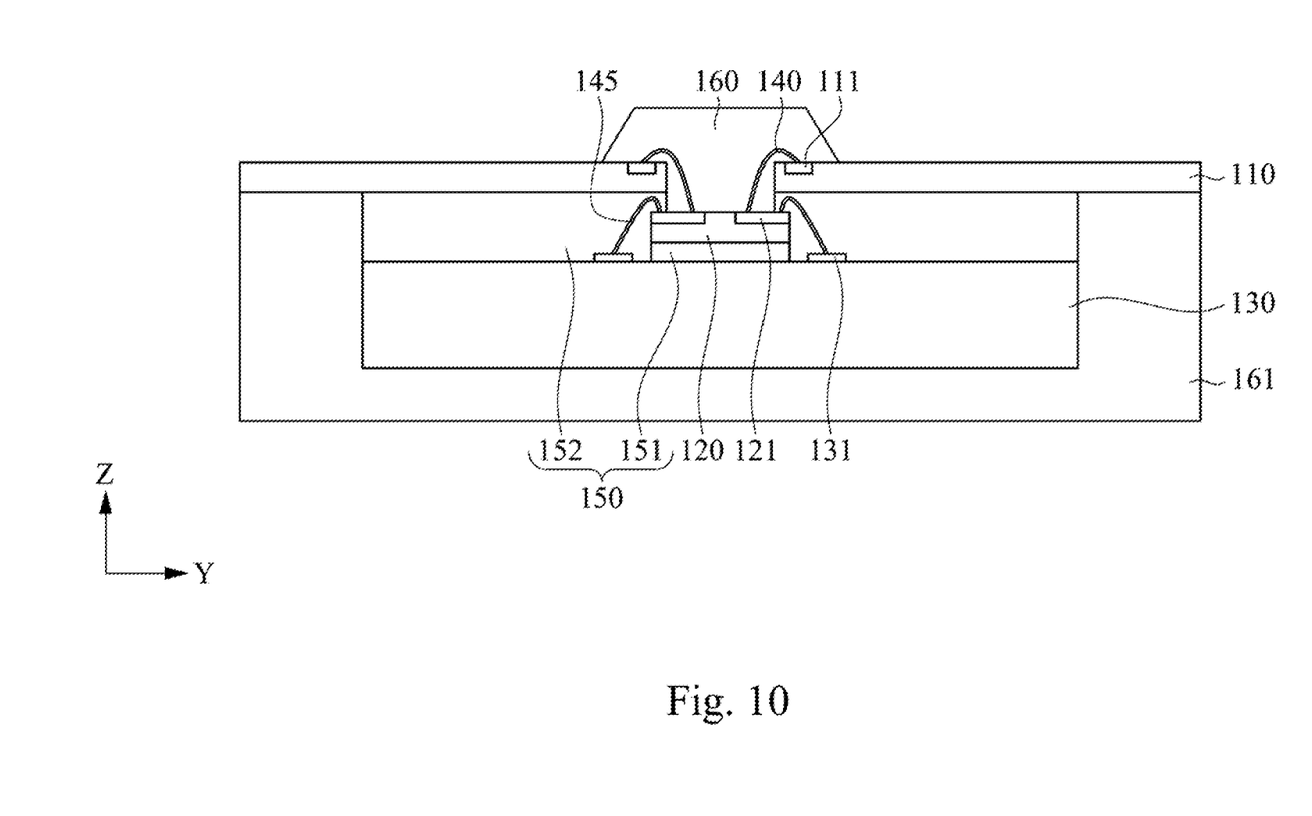

Referring to FIGS. 2 and 10. In operation 208, the chip 130 and the wire 140 exposed from the window 110W of the substrate are molded by molding compound 160. In this embodiment, the molding compound 160 is formed to cover the wire 140, the exposed top surface 120T of the substrate 120, sidewalls of the attach film 150 and the window 110W and a portion of the bottom surface 110B of the substrate. Therefore, the molding compound 160 is able to protect the wires 140 and the conductive pads 121 of the substrate 120. In this embodiment, as shown in FIG. 10, the top surface 110T (as illustrate in FIG. 8) of the substrate 110, a sidewall of the second attach portion 152 of the attach film 150 and the bottom surface 130B of the chip 130 are molded by a molding compound 161.

Figure 11:
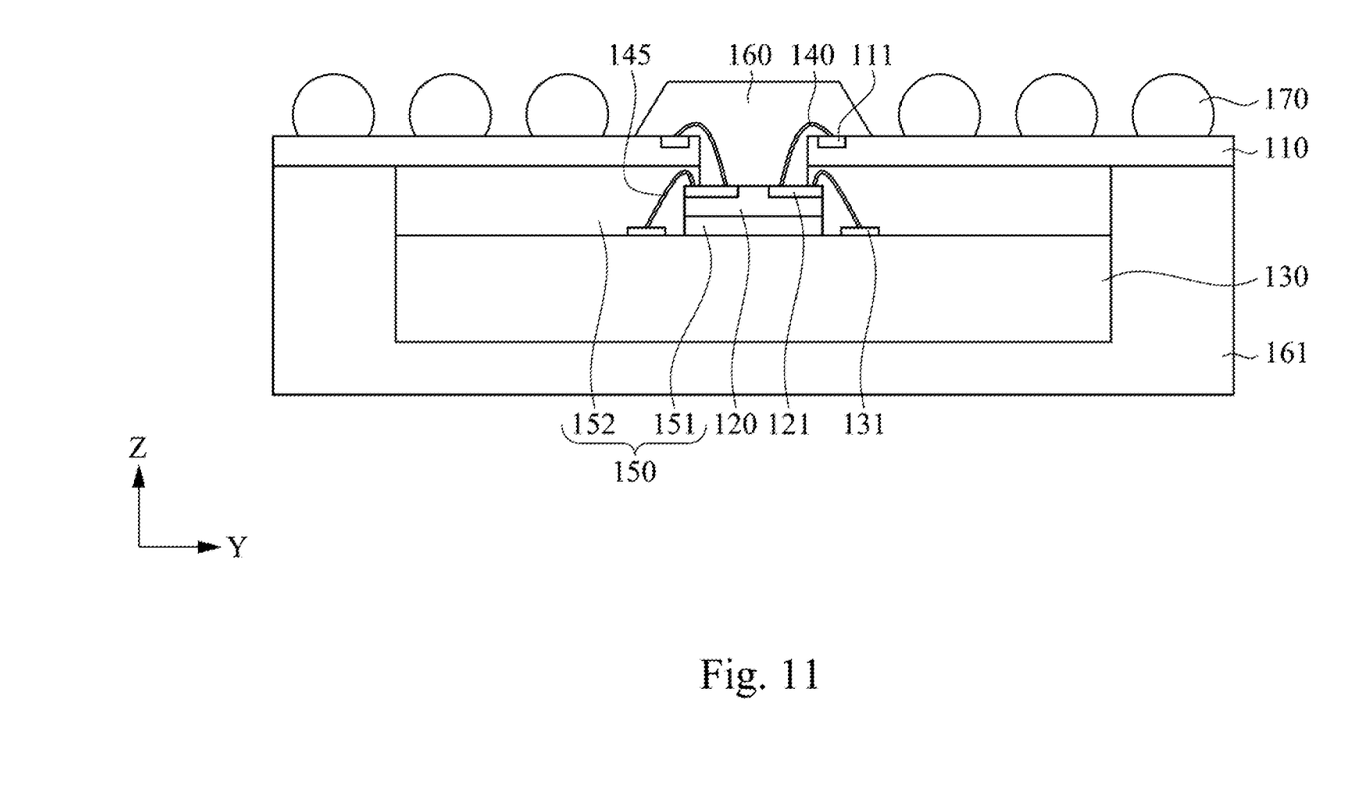

Referring to FIGS. 2 and 11. In operation 209, a plurality of conductive bumps 170 is formed on the bottom surface 110B of the substrate 110 and beyond the molding compound 161. In some embodiments, the conductive bumps 170 can be connected to the one or more conductive pads 111 on the substrate 110 through connecting wires inside the substrate 110.

Figure 12:
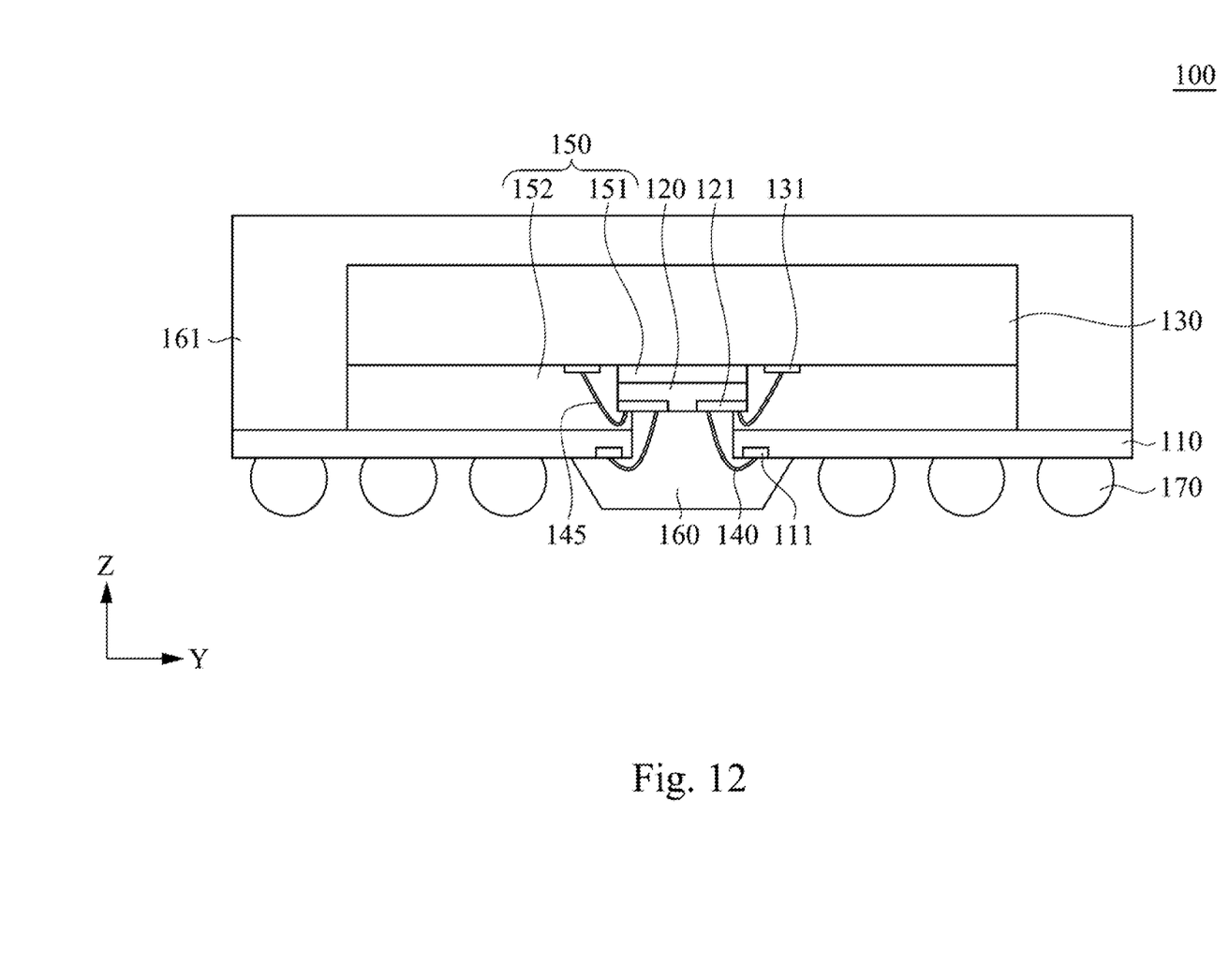

Referring to FIG. 12. Continued with operation 209 in some embodiments, the bonding substrates 110, 120 and the chip 130 are flipped, so that a package structure 100 can be provided. In an order from the bottom to the top, the second substrate 120 is stacked on the first substrate 110, and the chip 130 is stacked on the second substrate 120. The first substrate 110 includes the first conductive pads 111 on the bottom surface 110B. The first conductive pads 111 are bonded to the second conductive pads 121 of the second substrate 120 by the first wire 140 through the window 110W of the substrate 110. The face-down chip 130 includes the third conductive pads 131 and the third conductive pads 131 are located on the top surface 130T (as illustrated in FIG. 3) facing the substrate 110. The second conductive pads 121 are bonded to the first conductive pad 111 by the second wire 145.

Therefore, the chip 130 is electrically connected to the substrate 110 through the substrate 120. The substrate 120 can be regarded as a jump substrate spaced from the chip 130 and the substrate 110, and no further conductive pillar bump is required between the chip 130 and the substrate 110. In summary, a package structure 100 with addition substrate 120 between the chip 130 and the substrate 110, and time used for packaging the chip 130 can be reduced.

In some embodiments, as shown in FIG. 1A, more of the chips 130 can be bonded on the substrate 110 to form the package structure 100 in the similar operations. That is, the substrate 110 can includes a plurality of windows 110W in different locations along the direction x and the direction y, a plurality of the substrate 120 can be bonded to a plurality of the chips 130 at the same time by operations similar to the operations 201-204, and the chips 130 are bonded to the substrate 110 through the substrate 120 by operations similar to the operations 205-207, respectively.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A package structure, comprising:
   a first substrate comprising a top surface, a bottom surface opposite to the top surface, a window communicating the top surface and the bottom surface and a first conductive pad over the bottom surface;
   a second substrate located over the first substrate, wherein the second substrate is spaced from the first substrate and comprises a second conductive pad facing the top surface of the first substrate and exposed from the window;
   a chip located over the second substrate, wherein the chip comprises a third conductive pad facing the top surface of the first substrate;
   a first wire connecting the first conductive pad to the second conductive pad;
   a second wire connecting the second conductive pad to the third conductive pad; and
   an attach film located between the first substrate and the chip, wherein the third conductive pad and the second wire are covered by the attach film.

2. The package structure of claim 1, wherein the second conductive pad of the second substrate comprises:
   a first portion connected to the first wire and exposed from the window of the first substrate; and
   a second portion connected to the second wire and covered by the attach film and the first substrate.

3. The package structure of claim 1, wherein the attach film is filled with a space between the chip and the first substrate, wherein the attach film comprises:
   a first film portion covering a sidewall of the second substrate and extending between the first substrate and the second substrate; and
   a second film portion filled with a gap between the chip and the second substrate, wherein the second substrate is sandwiched by the first film portion and the second film portion.

4. The package structure of claim 1, wherein a portion the first wire is extended between the first substrate and the second substrate.

5. The package structure of claim 1, wherein the second conductive pad and the third conductive pad are connected by the second wire through the window.

6. The package structure of claim 1, further comprising:
   a molding compound covering the first conductive pad and the first wire.

7. The package structure of claim 6, wherein the second conductive pad comprises:
   a first portion connected to the first wire, exposed from the window of the first substrate and covered by the molding compound; and
   a second portion connected to the second wire and covered by the first substrate.

8. The package structure of claim 1, further comprising:
   a conductive bump located on the bottom surface of the first substrate.

9. A package structure, comprising:
   a first substrate having a first conductive pad;
   a second substrate located on the first substrate and having a second conductive pad;
   a chip located on the first substrate and having a third conductive pad, wherein the chip is located between the first substrate and the second substrate;
   a first wire connecting the first conductive pad to the second conductive pad;

a second wire connecting the second conductive pad to the third conductive pad; and an attach film filled with a space between the first substrate and the chip, wherein the third conductive pad and the second wire are covered by the attach film.

10. The package structure of claim 9, wherein the first substrate comprises a window exposing the second conductive pad of the second substrate, and the second conductive pad is connected to the third conductive pad by the second wire through the window.

11. The package structure of claim 9, wherein the attach film comprises:
   a first film portion covering a sidewall of the second substrate and extending between the first substrate and the second substrate; and
   a second film portion filled with a gap between the chip and the second substrate, wherein the second substrate is sandwiched by the first film portion and the second film portion.

12. The package structure of claim 9, wherein the first substrate comprises a first bottom surface in which the first conductive pad located on and a first top surface opposite to the first bottom surface, the second substrate comprises a second bottom surface spaced from the first top surface and a second top surface being with the second conductive pad and opposite to the second bottom surface, and the third conductive pad of the chip faces the first top surface.

13. The package structure of claim 9, wherein a portion of the first wire is extended between the first substrate and the second substrate.

14. A method of forming a package structure, comprising:
   providing a first substrate with a first conductive pad, a second substrate with a second conductive pad and a chip with a third conductive pad, wherein the first substrate comprises a top surface, a bottom surface opposite to the top surface and a window communicating the top surface and the bottom surface;
   attaching the second substrate on the chip;
   bonding a first wire between the second conductive pad and the third conductive pad;
   attaching the first substrate on the second substrate, wherein a portion of the second conductive pad is exposed from the window of the first substrate; and
   bonding a second wire between the first conductive pad and the second conductive pad,
   wherein attaching the top surface of the first substrate on the second substrate comprises attaching an attach film on the chip and the second substrate after the first wire is bonded between the second conductive pad and the third conductive pad, wherein the first wire is covered by the attach film and attaching the top surface of the first substrate on the second substrate by the attach film.

15. The method of claim 14, wherein attaching the second substrate on the chip comprises:
   attaching an attach film on a surface in which the third conductive pad is located on; and
   attaching the second substrate on the surface of the chip by the attach film.

16. The method of claim 14, further comprising:
   forming molding compound covering the second wire exposed from the window of the first substrate.

17. The method of claim 14, further comprising:
   forming a conductive bump on the bottom surface of the first substrate.

18. The method of claim 14, further comprising:
   flipping the first substrate, the second substrate and the chip after the second wire is formed.

* * * * *